United States Patent [19]

Murphy

[11] 4,235,221

[45] Nov. 25, 1980

[54] SOLAR ENERGY SYSTEM AND APPARATUS

[76] Inventor: Gerald G. Murphy, 153 Rock Hill Rd., Clifton, N.J. 07013

[21] Appl. No.: 68,906

[22] Filed: Aug. 23, 1979

[51] Int. Cl.³ .............. F24J 3/02; F03G 7/02; G05D 11/00
[52] U.S. Cl. ..................... 126/415; 60/641; 126/425; 126/427; 126/435; 126/437; 136/246; 165/18
[58] Field of Search ............... 126/415, 416, 417, 418, 126/421, 424, 425, 427, 428, 430, 432, 435, 437; 136/89 R, 89 P, 89 PC; 60/641; 165/18

[56] References Cited

U.S. PATENT DOCUMENTS

| | | | |
|---|---|---|---|
| 3,933,628 | 1/1976 | Varani | 126/415 |
| 4,010,614 | 3/1977 | Arthur | 60/641 |
| 4,054,124 | 10/1977 | Knoos | 126/437 |
| 4,063,419 | 12/1977 | Garrett | 126/437 |
| 4,119,143 | 10/1978 | Robinson | 126/437 |
| 4,136,674 | 1/1979 | Korr | 126/443 |
| 4,148,301 | 4/1979 | Cluff | 126/425 |
| 4,153,104 | 5/1979 | Ruder | 126/437 |
| 4,159,629 | 7/1979 | Korr et al. | 126/425 |
| 4,169,460 | 10/1979 | Popovich et al. | 126/437 |
| 4,169,712 | 10/1979 | Boyce et al. | 126/415 |

Primary Examiner—James C. Yeung
Assistant Examiner—Daniel O'Connor

[57] ABSTRACT

The present invention relates to solar energy collection and distribution systems and more particularly to such systems wherein the solar energy collecting elements, arrays or sections are disposed over or floated on a body of water while having associated control, distribution and auxilliary means largely disposed or contained on a land mass adjacent or nearby the body of water. The collecting elements or sections may also be supported on frames, structures or platforms slightly above the surface of the body of water to clear wave or tidal action and the like.

The invention also relates to associated means and apparatus for energy collection, conversion, conservation and distribution with which to economically and efficiently implement the purposes of the invention and extend its utility over a broad area.

12 Claims, 10 Drawing Figures

SOLAR ENERGY SYSTEM AND APPARATUS

SUMMARY OF THE INVENTION

Heretofore the development and implementation of extensive solar energy collection and distribution systems, particularly as applicable to a multiple of users, has been inhibited by lack of sufficiently large or contiguous areas for energy collection near the energy utilization points and also lack of suitably economical materials, means and techniques for effective collection, transmission, storage and distribution of available energy.

The present invention overcomes these restrictions by the utilization of solar collector groups, arrays or collector "Farms" disposed over the surface of sufficiently large bodies of water located reasonably near to population or industrial centers for utilization of collected energy. These water surfaces probably represent the cheapest available "Real Estate" for disposal of large energy collecting units and areas while presenting few problems of zoning or interference with industry commerce residential areas, traffic, transportation, recreational or environmental use and the like. Further, the water surface areas used may be selected to avoid interference or obstructions from structures, buildings, objects, hilly terrains, trees or vegetation and the like which would otherwise reduce energy collection efficiency.

The present invention overcomes economic and efficiency restrictions by employing recently developed light-weight, low cost materials such as rigidized foam plastics, plastic structures and structural materials, plastic piping and insulation, dry earth insulation contained in sealed water-proof compartments or enclosures, and floating energy collector units or sections certain ones of which are moveable and rotatable with very little drive energy to achieve collection orientation toward the sun. The invention further utilizes unique and efficient solar collector elements and means which are economical, certain types of which provide a composite energy collection and conversion to produce both thermal energy and electrical energy output. The composite type energy conversion collectors may combine thermal conversion, thermoelectric conversion and solar cell electric conversion to more fully achieve a substantially self-sustaining energy system by providing self-contained electric power means for a solar energy system control and for auxilliary functions.

The invention further provides for modular expansion of energy collection, storage and distribution means as development, demand and funding may call for, where collecting sections, storage reservoir sections, distribution sections and auxilliary means may be added as required. Alternative and auxilliary means provided includes both heating and cooling energy distribution for different weather conditions or seasons, supplementary electric power generation and distribution during seasonal availability, electrolysis of water, particularly salt water, for auxilliary stored hydrogen and oxygen fuel to aid back-up or peak energy or heating demand, auxilliary water heating means with additional fuel storage for further system back-up or peak heating demand, and auxilliary emergency thermal storage reservoirs for system carry-over or maintenance and for achieving high reliability.

Accordingly, one object of the invention is to provide solar energy collection means disposed at, near or slightly above the surface of a body of water.

Another object is to provide storage of collected solar thermal energy within such body of water for distribution to utilization points.

Another object is to provide storage of collected solar thermal energy separate from such body of water for distribution to utilization points.

Another object is to provide efficient distribution of collected thermal energy to multiple utilization points.

Another object is to provide efficient solar energy collecting elements for such energy systems which achieve a temperature gain over simple flat plate type collector elements.

Another object is to provide composite solar energy collecting means which combines solar cell electric conversion, thermoelectric energy conversion, and direct thermal energy collection and conversion for system use.

Another object is to provide means for alternative heating energy and cooling energy distribution for multiple utilization points.

Another object is to provide efficient supplementary electric power generation and utilization from collected solar thermal energy.

Another object is to provide supplementary energy storage means for carrying peak energy demands of a solar energy collection and distribution system.

These and other objects of the invention will be apparent from a detailed description thereof given in conjunction with the various figures of the drawing wherein:

Note: In the Figures, details of system control means, believed well known in the art, have been omitted to simplify discussion.

Figure 1:
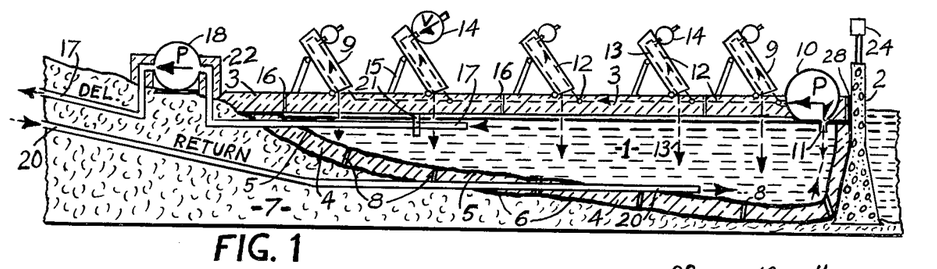
FIG. 1 is a side sectional view of a simple solar energy collection array, group or "farm" disposed over a body of water which provides thermal energy storage therein.
Figures 2, 3, 4, 5:
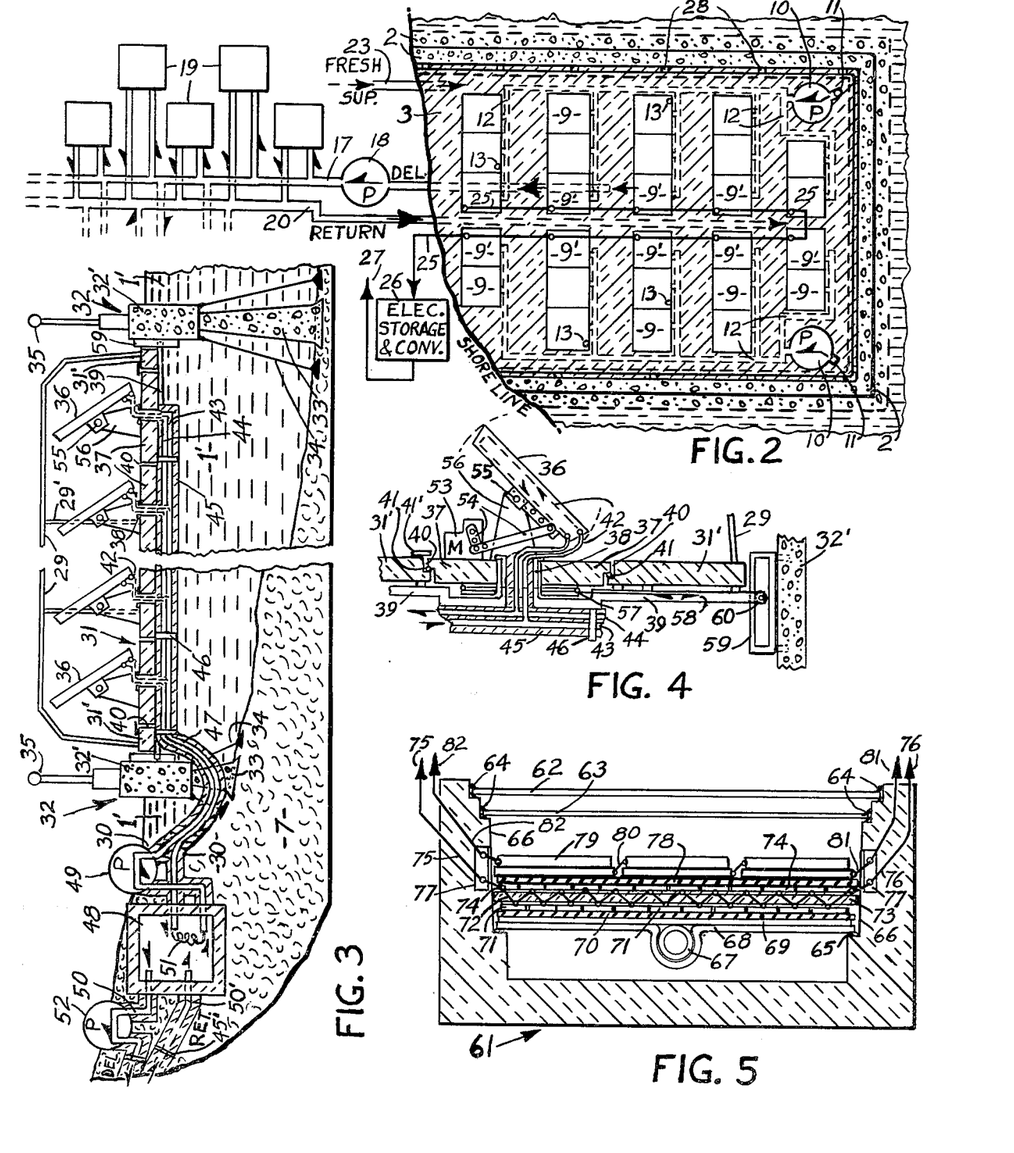
FIG. 2 is a plan view of the means of FIG. 1, showing additional features.
FIG. 3 is a side sectional view of a solar energy collection array or group, with collector modules or sections made moveably orientable toward the sun, disposed over a water surface which is, or may be, removed from shore line limits and wherein collected thermal energy is stored in reservoir means on shore.
FIG. 4 is a detail view in side section of energy collection means of FIG. 3, showing control and stabilizing means therefor.
FIG. 5 is an end sectional view of solar collector panel elements, applicable to FIGS. 1, 2, 3, 4 and 10, which provides composite type energy collection and conversion means for system use.

Referring to FIGS. 1 and 2, a thermal collecting body of water 1, which may be a portion of a lake, reservoir, bay, pond, ocean, sea, inlet or the like, is impounded by one or more walls, dams or barriers 2 in conjunction with a rising shore line limit on one or more sides, where available, and is substantially enclosed on its top surface by a thermal insulating platform 3 which is substantially floating or floatable on the water surface. Platform 3 is preferably constructed of light-weight semi-rigid material such as a closed-cell type plastic rigidized foam, styrofoam, polyurethane foam or the like, but may also be fabricated of a coated or impregnated light wood or may be formed of a quantity of rockwool or fiberglass material enclosed in a set of sealed plastic containers, disposed as a set of blocks or modules affixed together as a suitable layer on the water surface. Platform 3 is attached to, held together and supported by a light-weight rigid structural frame assembly preferably utilizing extruded plastic or light metal frame members, or treated and coated wood framing members and the like, to achieve a stable and insulating platform assembly of sufficient buoyancy to support an array of solar collectors thereon along with auxilliary apparatus and maintenance personnel as may be required.

Surrounding water body 1 on its bottom and sides is a layer of thermal insulating material 4 disposed between water-sealing layers or water barriers 5 and 6, separating the water body from the containing earth 7. Insulating material layer 4 may consist of thoroughly dried loose earthen material or sand, or alternatively may be of sawdust or commercial thermal insulation, and may comprise many sections or units of substantially water-tight bags, sacks or containers of such insulating material fitted together over the area with separating and abutting walls, skins or partitions as indicated at 8. Water barriers at 5 and 6 may consist of large integrated sheets of rubber, neoprene, plastic or asphalt, or of fabric impregnated or coated with such material, the barrier sheets being joined or sealed together in a manner to provide substantially continuous water sealing of the water body 1 from earth 7 to prevent the entry or exit of water to or from the earth and to maintain the insulating material 4 dry. Insulating material 4 and insulating platform 3 are to be of sufficient quality and thickness as to prevent appreciable heat loss from collected solar thermal energy in water body 1, the insulating efficiency being enhanced by the coating and/or sealing of the insulating material to prevent water and moisture entry.

Mounted on platform 3 is an array of solar energy collectors 9 arranged and spaced in suitable rows, banks or tiers thereon, the collectors being of either moveable, adjustable or fixed type and which may in each section or collector area shown consist of one or more collector panels of simple flat plate type, as is well known, or of a more efficient type and/or a composite type as will be described later. Collectors 9 are fed circulating thermal absorbing water from water body 1 by pumps 10 through intake/drain ducts 11 and through distribution ducts 12, with the solar heated water returned to water body 1 at approximately median to lower depths therein by return ducts as indicated at 13. Portions of ducts 12 and 13 are imbedded in the insulating material of collectors 9 and platform 3 to minimize heat loss from the circulating water. Collectors 9 are provided with vent valves 14 at their topmost water path limits to permit effective draining of ducts in cold weather. The collectors may be adjusted in tilt periodically, such as by moving or adjusting support legs 15 seasonally, by means well known to the art, for more efficient collection. Runoff crevices 16 are provided in platform 3 for disposal of rainwater or melted snow that may collect thereon, as may be necessary. Alternatively, such disposal may be provided by upper runoff channels to auxilliary pumps, not shown, which may remove the incident water to outside of water body 1 and avoid dilution thermally of the collected energy in water body 1.

With continued solar thermal energy collection, water body 1 will attain a temperature distribution and gradient from bottom to top according to the water circulation rate and paths therein, the thermal energy collection rate passed through the distributed collector heated water return ducts 13, and the external thermal utilization rate with associated intake or delivery and return flow paths. Water body 1 may typically be from a few feet to several yards in average depth depending upon the utilization rate, the overall energy collection and storage efficiency and local conditions permitting collection and accumulation of solar thermal energy, and it may be extensive in surface area to accomodate a large total utilization.

The heated water in water body 1 is drawn out near its upper surface through delivery (DEL.) pipeline or duct 17 by delivery pump 18 which pumps the heated water to multiple utilization points 19, which points may be dwellings, buildings or areas requiring thermal energy. After heat extraction at utilization points 19 the distributed water, or a portion thereof, is returned to water body 1 by way of return (RETURN) pipeline or duct 20 to a relatively low level in body 1 and at a point removed from the hot water delivery intake point in duct 17. Delivery duct 17 is supported within water body 1 to platform 3 by brackets or stirrups as at 21, and is insulated against heat loss at otherwise exposed areas as at 22 near pump 18 and through its external path to points 19. Ducts 17 and 20 are normally carried underground to and from the utilization points and are well thermally insulated throughout their runs, preferably by earthen materials maintained dry by means to be described later, or by commercial insulation. Due to hot water usage and/or evaporation from the system a fresh water supply, indicated at 23, may be brought in to water body 1 periodically, through control means not shown.

On large installations, warning signals, lights or beacons, as at 24, may be provided atop barriers 2 for clearance indications or safety guidance means pertaining to the installation.

A portion of the collector panels or elements in collectors 9 may be of a combined or composite solar energy conversion type, as will be described later, or they may be of separate electrical energy conversion type, indicated as sections 9', to provide direct electrical energy output for system auxilliary use or for electrical power supplied external to the system. The outputs from electrical conversion sections 9', which sections may be solar cell panels for example, are connected either in series or in parallel to electrical output bus 25 which carries the electrical energy to a system electrical storage and conversion section 26. Section 26 may provide and include electrical storage battery means, motor-generator equipment means, DC to AC inverter means or transformer means and the like, and is adapted to provide electrical power out for either remote distribution or for system use, such as for pumps, remote control valves, control means and the like. The electrical output of section 26, which may be AC or DC at suitable voltages, is indicated simply at the line or bus 27. It may be noted that the electrical energy conversion and storage feature described hereby can render the system substantially self-sustaining energy-wise where other electrical energy may be scarce, and is particularly advantageous in remote or new locations. It is to be understood that automatic sensors and automatic control means for startup, shutdown and draining of the system may be provided, by means not shown, for efficient system operation.

It is to be noted with respect to FIGS. 1 and 2 that considerable quantity of insulation material in items 3 and 4 around water body 1 may be required to attain a desired rate of thermal energy build-up in the total contained water volume, due to the relative surface-to-volume ratio as generally indicated. However, the insulation material in platform 3, being largely of preferably very light-weight material such as styrofoam or the like, provides the added factor of high buoyancy for the collector array mounted on it plus collector accessories such as pumps, ducts and control means, and also support for maintenance personnel as may be necessary. The ducts, except for those as are part of the actual thermal energy collecting elements, are preferably of extruded or fabricated plastic materials to provide light weight and non-corrosive characteristics. Water body 1 may be of potable quality provided that suitable purification and diversion of contamination is arranged therefor. Where non-potable water quality is acceptable, such as with sea water or other, due care must be given to corrosion prevention in system materials such as in pumps and distribution elements.

Platform 3 is slidably controlled or attached against surrounding barriers 2 by vertical track sections or channels 28 which are affixed to the barriers at suitable intervals around the platform periphery and which engage shoes or rollers affixed at corresponding intervals along the mating edge surfaces of platform 3 to provide substantial restraint against lateral movement of the platform while permitting moderate vertical movement thereof in accordance with possible changing water level in water body 1. This vertically slidable attachment tends to eliminate or minimize stresses in platform 3 which may otherwise occur and cause damage thereto.

Since, as noted above, large amounts of thermal insulation in platform 3 and in surrounding insulation 4 may be required to attain a desired temperature build-up in water body 1, a more efficient thermal collection and storage means will now be disclosed.

Referring to FIGS. 3 and 4, platform assembly 31 is disposed over water body 1' between surrounding barriers 32 and carries an array of collector units 36 which may be protected from weather by a covering dome or roof 29, preferably of clear plastic or plexiglass with support frame, which is mounted to fixed platform sections 31' and has intermediate support columns 29' carried to fixed sections 31'. Water body 1' extends laterally beyond barriers 32, the water extending outwardly an indefinite distance and inwardly to a shore line as indicated at 30 some distance removed. Thus the platform assembly 31 may be located a considerable distance, such as hundreds or even thousands of yards or more from the nearest shore line to avoid interference with commerce, recreation or other activities near or on the shore. Barriers 32 may consist of an upper sea wall or breakwater portion 32' substantially complete surrounding platform assembly 31 and having a thickness and a height above and below the water surface to suitably protect the platform against wave and tidal action, the barriers having support legs or pilings 33 carried to the water body floor and also having stabilizing guys 34 carried and anchored to the water body floor. The supports and guys are spaced at suitable intervals along the upper wall portions 32' around the periphery of the platform. Alternatively, the sea walls or barriers 32 may be carried around the complete platform periphery at full depth to the water body floor to attain a substantially full enclosure around and under the platform, at greater expense but providing more complete protection of the platform assembly from damage or instability. Warning or clearance lights 35 may be mounted atop the barriers 32 at intervals along the wall for safety precautions. The barriers 32 are typically constructed of reinforced concrete, but other materials may be employed as desired.

Platform assembly 31 carries an array of solar collector units 36 each of which are mounted individually on circular platform sections 37 which are rotatable about a central vertical tubular axle or bearing collar 38 for each section 37. The bearing collars 38 are affixed firmly to the platform understructure or support underframe 39. The underframe 39 is preferably constructed of suitable rigid plastic structural members which are of low specific gravity to aid in achieving a floatable total platform assembly. The platform assembly, including the fixed portions attached to underframe 39 and the rotatable sections 37 may be built up of modular precut and preformed blocks of rigidized foam plastic material, such a closed-cell styrofoam or the like, the blocks being cemented together and sealed against moisture absorption by suitable plastic cementing and coating materials. The fixed platform portions 31' attach to and are held in place by the underframe 39, and they surround the rotatable circular sections 37 with similar material and thickness as in sections 37 to essentially complete the remaining platform area to substantially cover the water surface or water area under the platform. Each circular section 37 has a annular separation crevice 40 or parting channel between it and the fixed surrounding portions 31', formed with a stepped-cut or offset land or bearing surface 41 carried uniformly around the crevice to provide a small slidable or roller bearing surface for peripheral support of the section 37 while permitting the section to be rotated easily in azimuth in a stabilized manner. Peripheral cleats 41', fixed on portions 31', limit sections 37 from upward shift.

The circular sections 37, together with the collector units 36 and their accessories mounted thereon, are substantially floating on the water in a manner to produce a very light bearing load on bearing areas 41 such that the sections may be rotated about bearing collars 38 with very little turning torque applied. Each collar 38 has a hollow center large enough to permit the supply and return thermal absorber fluid hoses or ducts 42 to pass down to the thermal absorber fluid cross trunk lines or ducts 43 and 44 below the platform as indicated. Ducts 42 are insulated and are flexible above the section 37 top surface in order to connect to and follow the moveable collector units. Fluid ducts 43 and 44 are surrounded with insulation 45, are supported from platform underframe 39 by brackets or stirrups 46, and are made substantially flexible at the carry-off point 47 from the platform underside where they pass to the left under a barrier section 32' toward the shore line at 30, the flexibility at 47 allowing for moderate platform movement due to wave or tidal action without duct damage. The fluid ducts 43 and 44 are carried to the insulated thermal storage reservoir 48, the absorber fluid being circulated from the reservoir to and from the collector units 36 by fluid pump 49. Reservoir 48 is proportioned and insulated to provide preferably several days carryover of thermal energy storage for system demand and may contain a heat exchanger means 51 for transferring thermal energy from the absorber fluid to a transfer fluid or second thermal fluid in the reservoir for external energy distribution. For such thermal distribution, insulated delivery (DEL) and return (RET) thermal fluid ducts or lines 50 and 50' respectively are run from reservoir 48 to and from system utilization points which are supplied by delivery pump 52.

For increased collection efficiency, the energy collecting units 36 may be continuously directed toward the sun in daytime, essentially as heliostats, by means well known. However for energy economy and simplicity here indicated, a motor drive means 53 with a crank and adjustable linkage 54 is arranged to tilt the collector unit about a horizontal axle 55, on mount pedestal 56, to provide collector elevation alignment as required. The motor drive may also engage the collar 38, by means not shown, in a controlled manner to effect rotation of the circular platform section 37 about the collar and provide collector azimuth alignment relative to the sun's position. Alternatively, each platform section 37 may carry a grooved pulley or sheave 57 on its underside affixed concentric thereto about the bearing collar 38. Two-way belts or pull-cables 58, indicated schematically, are wrapped around the sheave 57 and are carried to adjacent and like platform section sheaves for ganged rotation of a series or group of floating platform sections in unison, the cables for the series or group being driven by controlled motor means not shown.

The thermal fluid lines 50 and 50', normally carried underground, may be thermally insulated by dry earth material for economy, the earth material being enclosed is surrounding waterproof jacket segments or sleeve container segments along the lines and having adjoining or abutting waterproof barriers as indicated at 45', and to be described later.

The upper barrier portions 32' have attached thereto at intervals around the periphery of the platform assembly 31 a set of vertically running channel sections or restraining guides 59 which engage a corresponding set of bearing rollers 60 that are rigidly affixed through horizontal axle shafts attached to the platform underframe 39, the roller-to-guide channel engagement providing substantial lateral restraint of the platform assembly motion while permitting vertical platform motion in conformity with possible tidal or wave action experienced. Guides 59 are formed with vertically slotted edge portions adjacent to the platform which are adapted to accept extension arms which are part of underframe 39 and carry the bearing rollers 60.

The insulation 45 surrounding trunk lines or ducts 43 and 44 is preferably of light-weight closed-cell foam plastic type material which is further waterproofed by an outer jacket or covering of vinyl plastic, neoprene, rubber, or the like, in order to maintain a buoyancy to ducts 43 and 44 and a continued effective insulation thereof. Ducts 43 and 44 are preferably of plastic tubing, such as glass reinforced thermoplastic or polymer resin materials, rated for the temperatures and pressures required while maintaining a corrosion resistance, moderate flexibility, moderate self-insulation and a light weight for buoyancy, the shole providing an economy, efficiency and ease of installation.

Referring to FIG. 5, a composite type solar energy collecting panel section is shown which includes an outer insulating channel form 61 having two separate top transparent cover plates 62 and 63 sealed onto the channel form at points 64. Mounted within the channel form on ledges 65 and against side walls 66, and extending substantially for the active length in the channel, is a multiple sandwich of interposed depthwise layers of active elements as follows:

Thermal collecting and absorbing fluid tube 67, formed and bonded between thermal absorbing and conducting plates 68 and 69 provides collection of incident thermal energy and also provides cooling of the sandwich layers mounted above and against the plates. Tubes 67 and plates 68 and 69 are preferably of copper or aluminum material, and the plates are preferably coated with a selective black material which material minimizes heat reradiation therefrom while providing thermal conduction through it to the under metal as is well known in the art. Layer 70 is electrical insulation covering the upper face of plate 69 while providing thermal conduction through it, such as does berryllium oxide, zinc oxide or aluminum oxide and the like. Next above is a layer of thermoelectric elements 71 with series interconnecting electrical leads 72 carried across the thermal insulating and electrical insulating layer 73 to a set of corresponding hot junction thermoelectric elements in layer 74 just above. The thermoelectric elements in layers 71 and 74 are shown as multiple segments connected in series diagonally and progressing laterally, hot junction to cold junction alternately, with the end terminal leads 75 and 76 carried to insulated electrical terminal blocks 77 at the channel form sides and thence carried out of the collector channel for external utilization. It is to be understood that successive groups of thermoelectric element arrays in both layers 71 and 74 may continue or extend in tiers or sections, depthwise in the view, through the active length of the collector channel, with similar electrical interconnections to that shown, to gain a full thermoelectric energy conversion area in the collector as may be desired.

Next above thermoelectric element layer 74 and extending across it in the channel is an electrical insulation layer 78 which may be a relatively thin and fine insulating screen or grid form which permits effective heat transfer therethrough to the hot junction thermoelectric elements in layer 74. Mounted on insulation layer 78 is an array of solar cells 79, which may be of a common type such as cadmium sulphide cells or gallium arsenide solar cells, extending depthwise through the active length of the collector channel 61. Solar cells 79 are exposed directly to the collector incident sunlight and are shown electrically interconnected by cell jumper leads 80 and having end terminal leads 81 and 82 carried first to insulated terminal blocks 77 and thence outside the collector channel to external utilization points. The cells 79 may be interconnected in the total collector cell array in either series or parallel electrical combinations to gain the desired output voltage and current capability available. It is to be understood that the solar electric cells 79 and the thermoelectric elements in layers 71 and 74 may in each group or section only cover partially the total active available solar energy collecting area in collector channel 61, with each group or type spaced apart or disposed over separate and non-overlaying areas of the indicated layers shown, to enable substantially separate or interspersed solar energy collection and conversion for each type while achieving a somewhat greater energy conversion efficiency for each type in its effective area. In either case, the thermal absorber fluid in tube 67 along with the thermal absorber plates 68 and 69 will effect thermal energy collection and transfer while providing a cooling of the thermoelectric element cold junctions and/or the back surfaces of the solar electric cells, where used, to achieve a greater electrical energy conversion efficiency and also a protection thereof.

It will be understood that the thermoelectric elements in layers 71 and 74 along with associated insulating layers 70 and 73 and connecting leads 72, 75 and 76 may be omitted from the assembly 61 while retaining the solar electric cell array 79 and insulation layer 78 as an option for simplification, where the thermoelectric energy conversion efficiency obtained does not justify the added complexity. Similarly, the solar cell array 79 with insulating layer 78 may be omitted in favor of the thermoelectric array described where cost or efficiency dictates. Furthermore, solar energy concentrator elements, such as cylindrical lenses or concave cylindrical mirror sections, not shown, may be employed, by means well known, to increase either the conversion efficiency of the thermoelectric elements where used or the conversion efficiency of the solar electric cells where used. In either case, the thermal energy collecting and absorbing section including absorber fluid tube 67 and plates 68 and 69 will provide composite solar energy thermal collection while cooling the electrical energy conversion elements to gain increased conversion efficiency therein while effecting thermal protection thereof. The composite solar energy collection and conversion features of the panel of FIG. 5 is applicable to the collector panel sections 9' of FIG. 2 and to portions of the collector units 36 of FIGS. 3 and 4, as well as to collector arrays discussed later with respect to FIG. 10.

Figure 6:
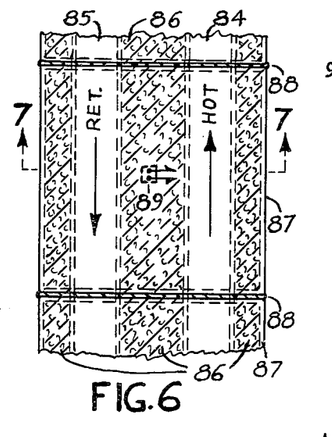
FIG. 6 is a top sectional view of system thermal energy conveying means, applicable to FIGS. 1, 2, 3, 4, and 10.
Figure 7:
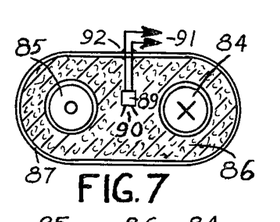
FIG. 7 is an end sectional view of FIG. 6, showing further detail.

Referring to FIGS. 6 and 7, a pair of thermal fluid conveying pipes, ducts or fluid lines 84 and 85, similar to delivery and return ducts 17 and 20 of FIGS. 1 and 2 and to delivery and return lines 50 and 50' of FIGS. 3 and 4, as well as similar to thermal energy delivery and return lines discussed with respect to FIG. 10 later, is shown as segments routed together and insulated with surrounding thermal insulation material 86. The material 86 is preferably well-dried earthen material for economy, but may be suitable commercial insulation, and is contained in a series of enclosing jacket segments or sleeve bags 87 attached at intervals to the fluid lines or pipes throughout the pipe line runs. The closed-end sleeve bags 87 are of substantially water-tight material suitable for underground installation, and may be of durable plastic, neoprene, silicone rubber or of fabric impregnated with asphalt or tar and the like, the sleeve segments or sections having end seals 88 abutting each other at intervals along the pipe run and arranged to provide effective water seals against and around the lines 84 and 85 at each juncture. A moisture sensor unit 89, which may contain a partially conductive dessicant or salt material which is rendered electrically more conductive by moisture entry, having moisture pickup wicks or probes 90, is provided in each sleeve interval or segment to monitor the effective moisture content or possible moisture entry into the segment as an indication of insulating quality of the insulation 86. Waterproof electrical leads 91 are carried out from the sensor 89 through water-tight feedthrough seals at 92 in the sleeve 87 for external testing, such as by means of an electrical resistance meter or bridge, to determine apparent insulation performance or degradation from time to time, the test leads terminating in a small junction box not shown.

The thermal insulation 86 may be a portion of the earth fill applied around the fluid lines 84 and 85 during underground placement thereof at installation of the thermal distribution system. Insulating material 86, whether of earth, sand or of commercial type or a combination thereof, should be thoroughly dried and free of stones and sharp objects before enclosing and sealing in the waterproofing sleeves onto and around the thermal energy conveying lines. Obviously, the protective sleeves 87 can alternatively be provided around each thermal line 84 or 85 separately and individually, if desired, to retain a more regular (circular) cross-section form for each, using slightly more jacket material and preferably providing a moisture sensor unit 89 in each separate jacket section or segment, for easier fabrication, maintenance or replacement. The insulation material 86 may be applied around the thermal lines as a combination of commercial type, such as asbestos, rock wool, fiberglass, foam plastic or the like, which is placed in a layer immediately surrounding the thermal line or lines with the well-dried filler earth material placed outside and annularly surrounding the commercial type but inside the enclosing sleeve bags as described.

Similar waterproof sleeve bag enclosure means for insulation, and preferably using light-weight closed-cell foam plastic type insulation for buoyancy, may be applied as the thermal line insulation 45 for the fluid lines 43 and 44 which are carried under water in the arrangement of FIGS. 3 and 4.

Figure 8:
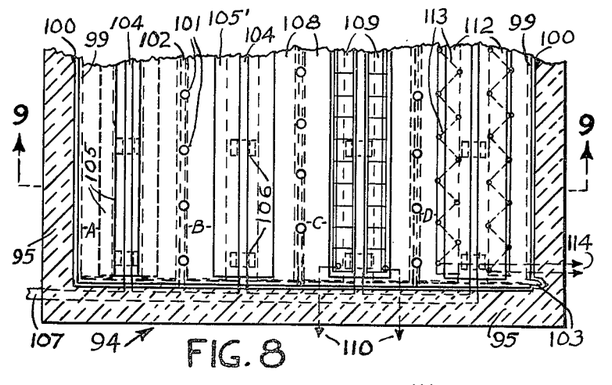
FIG. 8 is a top partial view of solar energy collector panel means adaptable to FIGS. 1, 2, 3 and 10, and showing separate and combined type energy collecting elements which provide both electrical energy output and thermal collection temperature gain as compared to simple flat plate type solar thermal collector panels.
Figure 9:
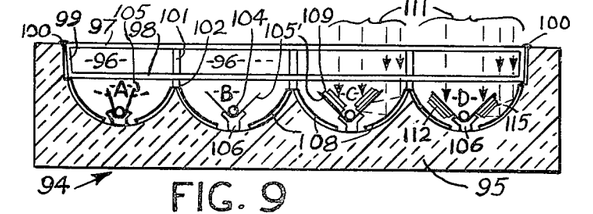
FIG. 9 is a sectional view taken of FIG. 8, showing further details.

Referring to FIGS. 8 and 9, a solar collector section or panel 94 consisting of insulation material 95 as a bottom and side frame, structure or form is disclosed having a top transparent dual plate cover assembly 96. The cover assembly is an evacuated flat housing or enclosure which includes an upper or outer plate 97 and a lower or inner plate 98, the plates being preferably of highly light-transmissible glass, with short side housing members 99 of similar material attached and carried around the full edge periphery of the plates to form an integrated, enclosed, sealed and substantially evacuated assembly and provide excellent thermal insulation to retain collected solar input energy. The cover plate assembly 96 contains within it a set of internal support and spacing pillars 101 affixed between plates 97 and 98, the pillars being of similar material to the plates and being fused or cemented to the plates at frequent intervals in rows above and next to support ridges 102 formed in the panel frame structure between compartments as shown. Pillars 101 are arranged, sized and spaced in a manner to cause very little obstruction of the solar insolation to the collecting area and yet enable the cover assembly to sustain a near vacuum condition in its interspace between plates 97 and 98. The interspace of cover assembly 96 may be evacuated through a small exit tube such as at 103, after which the tube is sealed, the exit tube being protected in the panel unit 94 by a recess therefor in the insulation material 95. The cover assembly is weather-sealed into the panel frame 95 around the full peripheral panel internal edges 100 by a suitable joint sealant such as a silicone rubber sealant.

The panel 94 contains under the cover assembly 96 four collector or absorbing compartments A, B, C and D, which are alike in form and dimension and are of a semicylindrical concave shape extending the active energy-collecting length of the panel. Each compartment contains a longitudinal thermal absorber unit consisting of an absorber fluid tube 104 thermally bonded to an absorber plate 105 or 105' having a V-form cross-section or a cross-section including the fluid tube having appreciable vertical depth in the concave compartment, which plate is mounted and held centrally in lateral position and longitudinally at uniform depth in the compartment by a series of formed support blocks 106. Blocks 106 are thermally insulating and may be of nylon material or the like, and are affixed at intervals to the back panel form 95 along the bottom center of the compartment and are also affixed to the absorber plate. Fluid tubes 104 in the several compartments meet in end headers 107 in the panel to carry the thermal collector fluid into and out of the panel 94 as required. In compartment A, to the left in the Figure, the absorber plate 105 is shown as a narrow V-form in cross-section (solid line in FIG. 9), with an optional upper and wider flair in cross-section (dash line), as compared to the wider V-form cross-sections of absorber plates 105' in the compartments B, C and D to the right, to illustrate the variations in absorber plate form and cross-section that may be employed for certain purposes. The smaller and narrower the absorber plate, which may also be of short parallel U-form sides running vertically, or the plate may be omitted leaving the absorber tube 104 only, the high the degree of concentration of solar energy on the absorber that must be provided for good collector efficiency but the absorber and the absorber fluid will attain a higher operating temperature, other conditions being equal. In the present design, in the limit with omission of the absorber plate as such, the absorber tube 104 may be formed as a flattened tube cross-section oriented centrally and vertically elongated in the compartment in a manner to substantially enclose a vertical focal region for compartment energy concentrating elements to be described. In any case, the projected area or projected width of the absorber plates 105 and/or 105' or of the absorber tubes 104 toward the sun is appreciably less than the projected area or width toward the sun of the corresponding compartment in which it is mounted. In each compartment along the back surfaces thereof in the panel insulating form 95 is attached two longitudinal cylindrical concave mirror segments 108 extending the active length of the panel, the segments being proportioned and positioned to concentrate those sun's rays incident to the compartment onto the side or underside of an absorber plate or tube which rays are not intercepted directly by the frontal projected area of the absorber surface. Mirror segments 108 may be portions of a circular concave cylinder for economy, or may be of a parabolic concave cylinder for greater precision.

Since the absorber plate or unit, as stated, may have appreciable vertical cross-sectional depth in its compartment so as to present a substantially broad depthwise focal region to the concentrating mirrors 108, the mirrors need not be highly precise optically and may therefore be essentially segments of a circular cylinder, or partially flatted in contour, to permit simple construction. With the appreciable depth of focal region provided by the absorber, the mirrors, whether they are partially flatted, circular or parabolic in cross-sectional contour, will provide effective concentration of the incident solar energy on the side or underside of an absorber unit even though the frontal plane of the collector panel 94 may be misaligned moderately from the preferred normal to the incident sun's rays, the required alignment being less critical than that pertaining to other optical solar energy concentrating collectors known to the art. The mirror segments may be formed, for example, of aluminized plastic sheet material, such as Alzac, and affixed smoothly on a uniform concave surface of an extended rigid cylindrical segment of fiberglass material or the like which is then attached to the back formed surfaces of the compartments as shown, to achieve an economical construction. As the absorber units are relatively small in cross-section and in width span with respect to the width span of a containing compartment, A, B etc., with the effectiveness of the concentrating mirrors 108, and with efficient thermal insulation surrounding the absorbers, including the evacuated frontal cover assembly 96, there will result an appreciable thermal temperature gain in the collector absorber fluid and an appreciably greater thermal collection efficiency over a simple flat plate type solar energy collector as well known in the art. For greater thermal collection gain and higher absorber fluid operating temperature, the absorber plates 105 or 105' may be reduced in cross-section or even omitted, except for cases where certain composite operating features to be described presently are desired, leaving the absorber fluid tubes 104, of relatively small cross-sectional area, as the absorber surfaces, and if in addition a relatively higher accuracy of focus of concentrating mirrors 108 on the absorber tubes is provided as well as a relatively similar rate of absorber fluid flow in tubes 104 is provided, a higher collection temperature and heat content in the absorber fluid will be achieved. The thermal absorber fluid in tubes 104 may be of a higher boiling point than ordinary water, and may be a fluid such as ethylene glycol, a glycol and water mixture or a heat transfer fluid such as Dow Corning type Syltherm 444 or the like. The thermal absorber plates and fluid tubes, as the case may be, are preferably coated with a selective black material or paint to minimize reradiation of received solar thermal energy, thereby improving collector efficiency. The higher thermal collection temperatures, as compared to simple flat plate type collectors, resulting from the means described with respect to compartments A and B above, the contingent upon the absorber fluid flow rate used, is achieved with an economy of materials and is applicable to the solar energy collection and conversion systems described herein as well as to others.

The elements in compartments A and B provide only thermal energy collection means as shown. In compartment C the absorber plate 105' contains mounted on its front or top side area a series or array of solar electric cells 109 extending the length of the absorber active portion, the cells having suitable electrical interconnections, not shown, and also having the combined electrical output connection leads 110 carried to outside of the panel 94 for external use. It will be understood that the solar cells 109 are suitably insulated electrically from one another and electrically insulated but not thermally insulated from the mounting absorber plate so that they may be cooled thereby to improve the solar cell operating efficiency. The central portion of the incident solar energy or rays 111 to the compartment, as sketched, will strike largely the top faces of the solar cells 109 to energize their output while in the side regions of the compartment the rays will pass beside the frontal absorber area and be reflected by the mirror segments 108 to the back surfaces of the absorber plate to produce thermal energy absorption therein.

In compartment D a multiplicity of thermoelectric elements 112 are mounted along the undersides of the absorber plate extending for substantially the active absorber length, the elements 112 having suitable electrical and thermal insulation arranged similarly to that described with respect to the thermoelectric elements of FIG. 5, with the hot junctions being outward and the cold junctions in thermal contact with the absorber plate for cooling. The elements 112 have suitable electrical junction interconnections, indicated as 113, the resultant combined electrical energy output being carried by electrical output leads 114 for external use. The central portion of the incident solar energy rays 111 to compartment D, as sketched, will be intercepted by the front or top surfaces of the absorber plate and fluid tube while the rays entering the side regions of the compartment will strike the mirror segments 108 and be reflected as indicated at 115 to impinge largely on the thermoelectric hot junction areas to energize their electrical energy output.

A group of array of collector panels 94, containing a portion or all of the means described with respect to FIGS. 8 and 9, may be employed in a modular build-up of solar collector units or collector sections as discussed with respect to any of the solar energy collection and conversion systems described herein. It will be understood that in the individual collector panels 94, and in a combination of such collector panels as may be used in the collector sections 9 and/or 9' of FIGS. 1 and 2, the collector units 36 of FIGS. 3 and 4, or the collector sections to be discussed in relation to FIG. 10, the proportion of solar energy collecting area utilized for solar cell electrical conversion and area for thermoelectric energy conversion as compared to area utilized for solar thermal energy collection and transfer may be varied in either the panel unit construction and/or in the total collector unit or collector section construction, configuration and adaptation in a combined solar energy collection system according to economic or other considerations. Furthermore, in a complete solar energy system, the proportion of panels, collector units or collector sections utilizing primarily solar thermal energy collection and transfer versus those utilizing additionally solar-to-electrical energy conversion may be altered periodically or seasonally by changing out modularly placed collector panels, collector units or collector sections as the system energy demands may require. The combined thermal energy and electrical energy conversion features of the panel 94 provide means for achieving, in a complete solar energy conversion system, substantially self-sustaining electrical power for auxilliary system use, such as for pumps, collector alignment drives, control apparatus and the like, as well as to supply electrical energy externally to the system during periods of low hot thermal energy or heating demand.

Figure 10:
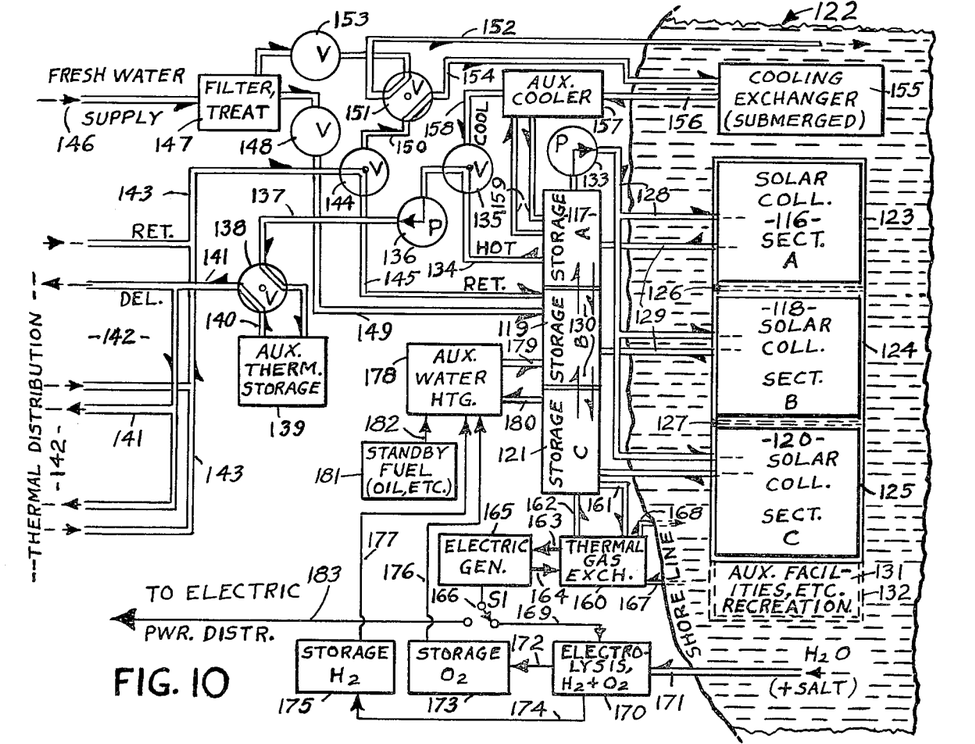
FIG. 10 is a plan view of a composite solar energy collection, conversion, storage and distribution system having several optional features.

Referring to FIG. 10 there is shown in a diagrammatic plan a composite solar energy collection, conversion and utilization system for adapting previously described principles and methods and also for enhancing system utilization capability, overall efficiency and community acceptability with certain options and features. Solar energy collecting sections or platforms 116 (Sect. A), 118 (Sect. B), and 120 (Sect. C) are disposed off-shore and on or near the surface of a relatively large body of water 122, the platforms having respectively corresponding surrounding breakwater structures or barriers 123, 124 and 125, similar to those previously described. Correlated therewith are the on-shore thermally insulated thermal energy storage reservoirs 117 (Storage A), 119 (Storage B), and 121 (Storage C) corresponding respectively to each platform as shown. Each collector section or platform along with its protective barriers, with its thermal energy feed and return lines, 128 and 129 respectively as shown, and with its corresponding thermal storage reservoir may be arranged entirely similar to that described with respect to FIGS. 3 and 4. The showing here of the separate platforms, feed lines and reservoirs in intended to indicate the total energy system may be constructed, installed and implemented as modular system sections of like design, the sections being extended or increasing in number as energy demand and funding may authorize. Thus the barrier partition 126 between platform sections A and B and barrier partition 127 between platform sections B and C each represent interim protective barrier segments in the progressive modular expansion of the system. The reservoir sections 117, 119 and 121 also represent modular increments in construction as complete individual sections initially, but they may later be interconnected for cross thermal fluid flow, as indicated schematically by the pairs of flow arrows at 130, across the section partitions to provide for a common or combined type of system operation with better control of overall thermal capacity and distribution. Of course, the indicated cross flow may be dispensed with, or it may be interrupted periodically, by cut-off controls not shown, to provide for system thermal energy diversion, for different applications and temperature levels in different sections, as will be described later, and also for system maintenance or emergencies and the like.

An extension to the collector platform sections or areas is shown by the added platform section 131, labelled "Aux. Facilities, Etc, Recreation," which section may substantially float on water body 122 and adjoin the collector platforms. Platform 131 has a protective surrounding barrier section or extension 132, and is constructed of light-weight, waterproofed, rigid or semi-rigid materials and underframing in a manner to provide sufficient stability, buoyancy and supporting means to carry, contain, support and/or house auxilliary system equipment and facilities such as pumps, drive means, control means and electrical storage and conversion means associated with operation and maintenance of the solar collector platforms. Platform 131 may also be extended, constructed and adapted to provide and contain public recreation or amusement facilities thereon, similar to oceanfront or beachfront facilities, including boardwalks, concessions, gambling casinos, fishing piers, boating docks and means providing frequent boat transportation to and from shore, the whole facility devised to render the entire energy development project and system more attractive and acceptable to nearby communities and perhaps thereby attract and enable easier fund raising therefor as a public development program. For such extension providing public facilities, platform 131 may utilize not only a considerable quantity and thickness of buoyant platform material and underframe but also may utilize a more complete support understructure with a series or array of columns or pillings, not shown, carried from the platform and its underframe to the water body floor and adapted to provide adequate support and stability.

Where the solar collector sections 116, 118 and 120 and their corresponding storage reservoirs 117, 119 and 121 are all intercoupled and operate similarly with the same type thermal absorber fluid, pump 133 provides recirculation of the thermal absorber fluid from the storage reservoir sections through the group of common feed lines 128 and common return lines 129 to and from the several solar collector sections during active solar energy collection periods, the fluid lines normally being well insulated thermally similar to those described with respect to previous Figures. For hot thermal energy distribution to, and return from, the utilization area at 142, hot fluid from the storage reservoir sections 117, 119 and 121 is carried by (HOT) duct or fluid line 134 through alternate routing valve 135, connected as shown, to thermal delivery pump 136, which pump provides forced delivery through fluid line 137 to the parallel path or dual path selector valve 138 which may be located near the intended thermal energy utilization area. With selector valve 138 connected or thrown as shown, the hot fluid is fed into the regional auxilliary thermal storage reservoir 139 which reservoir is thermally well insulated and may be located at such an elevation as to permit gravity feed therefrom to the utilization area 142, otherwise a second delivery pump, not shown, is required at fluid line 140 to provide for further delivery from auxilliary reservoir 139 through the second path of valve 138 and through line 141 to the "Thermal Distribution" or utilization area. Auxilliary storage reservoir 139 is here provided as local safety or system back-up storage in case of maintenance or emergency requirements, but it may alternatively be adapted as the system primary thermal storage means if desired.

The thermal fluid is carried from reservoir 139 through line 140 and through selector valve 138 as shown to the set of external delivery (DEL) lines 141 for thermal energy distribution to the area 142 as indicated. When dual path selector valve 138 is thrown to its alternate position (90 degrees from that shown) auxilliary reservoir 139 is shut off from delivery and closed upon itself, and the thermal fluid in line 137 is passed directly into delivery lines 141. After thermal energy extraction in the thermal distribution area the thermal fluid, or portions thereof, is carried by return (RET) lines 143 through alternate path selector valve 144, set as shown for warm fluid return to storage, and thence through return line 145 back to the primary storage sections 117, 119 and 121. It is understood that the thermal lines shown are typically carried underground through most of their route and are preferably well insulated by means such as described earlier herein.

For system heat energy collection and distribution in a most economical manner it is preferable that the thermal fluid employed be fresh, clean, potable water on both the solar energy collection side and also on the thermal energy distribution side of the system to provide the greatest utility to users with little danger of corrosion or damage to presently available plumbing and apparatus desired for use with the system. However, the thermal fluid on either the energy collection side or on the thermal distribution side may be salt water, sea water, non-potable water, water mixed with antifreeze solution such as ethylene glycol, or other fluids where due precaution is taken against corrosion or misuse in the system. Where potable water is employed for the thermal distribution side and another fluid, such as salt water or an antifreeze solution with part ethylene glycol, is employed on the solar energy collection side, or in certain collector sections thereof, appropriate fluid-to-fluid heat exchanger means, not shown, may be adapted in the corresponding thermal storage sections 117, 119 and 121 to effect isolation and protection of the potable water to be delivered to the thermal distribution area. In those cases where the system employs fresh or potable water for thermal energy distribution, a fresh water supply, indicated at 146, is provided and brought in through the filter and treatment unit 147 and thence through control valve 148 and through charging line 149, which line carries the supply into the thermal storage sections to replenish and/or flush out the thermal fluid in the system periodically. For flushing operations it will be noted that selector valve 144 on utilization return line 143 and also the dual path selector valve 151 may each be thrown to the alternate positions from that shown in the Figure, that is substantially 90° about the center, to enable discharge of return thermal fluid through lines 143, 150 and 152 to water body 122. It will be understood that water purification and/or chemical treatment may be employed at other segments in the system than that shown to maintain water quality as required.

For warm weather periods or seasons when the system hot thermal energy capacity and delivery to distribution may not be fully required, alternate system cooling energy delivery to the utilization area 142 is provided as follows: With selector valves 135, 138, 144 and 151 thrown to their alternate positions from that shown, that is substantially 90 degrees clockwise in the Figure, fresh water, which may also be cool, is drawn into the system from fresh water supply 146 through filter and treatment unit 147, thence through control valve 153 and through selector valve 151, and thence through line 154 to the large cooling heat exchanger 155 which is submerged off-shore and well below the surface in water body 122. Cooling exchanger 155 is proportioned and adapted to provide substantial cooling of the incoming water in line 154 according to the effective temperature of water body 122 surrounding the exchanger at the depth placed, the depth preferably being near the water body floor. Suitable supporting and protective means is provided and adapted to prevent the exchanger from being reduced in efficiency due to otherwise accumulating a covering of silt or foreign material in time. The cooled water from cooling exchanger 155 is carried by the output fluid line 156 to an optional cooling booster or auxilliary cooling unit 157, placed on-shore, the circulating water being further cooled therein and then passed through output line 158 and through selector valve 135, thrown 90 degrees clockwise to that shown, to the main utilization delivery pump 136. Aux. cooling unit 157 may be a separately powered refrigeration type water cooling means, but is preferably, as here indicated, a heat pump type cooling means wherein thermal fluid from a hot storage reservoir, section 117 for example, having been heated to near or above the boiling point of ordinary water is carried by the pair of input and output fluid lines 159 from the storage reservoir into and out of cooler unit 157 which produces thereby, using auxilliary means therein, not shown, an effective cooling of the water passed therethrough from line 156 to line 158. For such heat pump type cooling operation the solar energy collector sections, section 116 for example, may employ certain types of energy concentrating collector elements, such as discussed previously herein, and may also employ a high boiling point type of absorber fluid such as mentioned earlier, to produce a relatively high thermal storage temperature, above the boiling point of ordinary water, in the corresponding reservoir storage fluid, as in reservoir section 117, to achieve higher thermal capacity and heat pump operating efficiency. From the utilization delivery pump 136 the cooled water from line 158 is forced and carried through the delivery line 137 directly to and through the distribution lines 141 to the utilization area, bypassing the auxilliary thermal storage reservoir 139. Pump 136 may also provide the suction required to draw the charging water from fresh supply 146 through the path just described for the distribution cooling cycle. After the cooling cycle system is charged, selector valve 151 may be returned to the position shown in the Figure to permit recycling or recirculating the returned cooling water, now warmed, from the utilization area on return lines 143 through lines 150 and 154 to the cooling exchanger 155 for repeat cycle operation. Pump 136 may then provide both the suction force and the pressure or delivery force required for the total cooling cycle.

An alternative and optional arrangement for the system cooling cycle operation is provided wherein the fresh water supply 146 is not used, the submerged cooling heat exchanger 155 is dispensed with and also the AUX. cooling unit 157 may or may not be employed, to achieve a system simplification and economy with a somewhat reduced cooling capacity. In this reduced system arrangement cooling intake line 156 originates with its water intake end, which is preferably provided with a suitable intake filter, not shown, carried or disposed at a substantially cool region, normally at an appreciable depth and an appreciable distance from shore, in water body 122 from which it picks up and accepts intake water directly for cooling energy to be distributed. Path selector valves 135, 138, 144 and 151 are each maintained at their alternate selective positions from those shown in the Figure. The cooling water entering intake line 156 passes into the connecting (COOL) line 158 and then through selector valve 135 into and through suction and force pump 136, thence through line 137 and through selector valve 138, and thence directly into and through the distribution and delivery lines 141 for distribution to utilization. The utilization points, which may be buildings and the like, may have provided therein suitable heat exchanger means and also local distribution means adapted to accept the cooling water delivered thereto and to thereby produce an effective cooling or air conditioning of the utilization area or buildings, as may be desired. After cooling extraction, the somewhat warmed circulating water is fed back into return lines 143 and passed through valve 144, then through line segment 150, then through valve 151 and finally through line 152 to be discharged into water body 122. This discharge into water body 122 is preferably disposed at an upper level therein and at a point substantially removed or distant from the cooling water intake point in line 156.

It will be noted that this last-described cooling cycle arrangement is very simple and economical to implement, once the previously-described hot thermal collection, storage and distribution system has been provided, and it may well augment any other cooling or air conditioning means available to the utilization points and thereby effect a considerable energy saving in a total system. Further, if hot potable water is required at the utilization points periodically during the normal (hot or humid weather) period of cooling cycle operation, and also if the water in water body 122 is not potable, the hot potable water may be delivered by either of two methods as follows: in a first method, the utilization points are individually provided with hot potable water storage means adapted to carry, for example, for several day's usage. The hot water replacement in such local storage means is then provided by periodically reverting from the system cooling cycle operation to the hot thermal delivery cycle, previously described, for a short operating period, for example overnight, whereby also in such process suitable provision is made to flush out or drain any undesired non-potable or cool water in the system before delivery of the hot potable water. In a second or alternative method, the local hot water storage means at individual utilization points; as aforesaid, may be minimized or dispensed with, and the local hot storage may alternately be provided to a multiple of users by adapting one or more auxilliary hot thermal storage reservoirs, such as reservoir 139, for such local storage means. The local hot storage reservoirs may be replenished or recharged with hot water at intervals by periodically reverting from the system cooling cycle operation to the hot thermal delivery cycle and by flushing out non-potable water from feed and return lines used in common by both the cooling cycle operation and the hot water delivery cycle operation. Delivery from the auxilliary hot storage reservoirs to the utilization points is preferably made through separate feed and return lines, not shown, from those used for cooling water delivery thereto to minimize thermal losses and flushing requirements. It is to be noted that the system cooling cycle operation as described above presumes the use of a much greater flow rate of cooling water, and which may be non-potable, than is normally provided or required in present systems for potable cool water usage at the utilization points.

The composite solar energy collection, storage, and distribution system of FIG. 10 is extended and enhanced in utility, efficiency and duty cycle on a year-round basis by additional means as follows: collector section 120 is arranged in this case with solar concentrating collector elements and utilizes a relatively high boiling point type absorber fluid, as described earlier herein, to supply and achieve in corresponding storage section 121 relatively high stored absorber fluid temperatures that are preferably above the boiling point of ordinary water, by means as described earlier. From the thermal storage section 121 the stored hot absorber fluid therein is circulated through a thermal gas heat exchange unit 160 by way of input line 161 and return line 162 as shown. Thermal exchange unit 160 contains pump and control means for handling and circulating the hot absorber fluid and also contains a pressure boiler type heat exchanger section, which section is charged with a relatively low boiling point type working fluid, whereby the hot absorber fluid circulated from section 121 is applied and passed over the boiler heat exchange surfaces and thereby produces within the boiler substantial working gas pressure as the working fluid is heated and vaporized due to heat extraction from the absorber fluid. The low boiling point working fluid may be, for example, sulphur dioxide, ethyl chloride, freon-12, freon-22, or ethyl amine or the like, and preferably has a relatively low heat of vaporization to provide excellent system working efficiency. The working gas pressure from the boiler in exchange unit 160 is applied through output pressure line 163 to the gas-electric generator 165, which may be a turboelectric type operating on a Rankine cycle, whereby electric output energy is produced and connected to electric power switch 166 (S1). The spent and cooled working gas from generator 165 is carried back through return gas line 164 to thermal exchange unit 160 where the gas is condensed to liquid form with the aid of cooling water in a second heat exchanger in unit 160. The cooling water is brought into thermal exchange unit 160 from water body 122 through input cooling line 167 and is returned to water body 122 through output cooling line 168. The condensed working fluid is then injected into the pressure boiler of exchange unit 160 to enable repeating the working cycle and thereby produce generated electric power. The second heat exchanger in unit 160 may include further means such as gas expansion valves and a liquid accumulator section to aid in condensation of the working gas.

With electric power switch 166 connected to electric line 169 the generated electric output power is applied to an electrolytic conversion unit 170 which converts the electric energy to suitable DC levels and proportions for electrolytic conversion of water. Conversion unit 170 is adapted to receive intake salt water, or water made electrolytic, from water body 122 on intake fluid line 171 and to produce electrolysis of the water into its gaseous constituents, hydrogen and oxygen. The oxygen constituent is passed through gas line 172 and stored, preferably under pressure, in storage tank 173; likewise the hydrogen constituent is passed through gas line 174 and stored, preferably under pressure, in storage tank 175. The stored hydrogen and oxygen, thus produced, may be accumulated by the described solar energy system during periods of low hot thermal energy demand, such as in the summer season, and may then be utilized during periods of high heat energy demand, as in cold weather, by applying the gases through gas lines 176 and 177 to the auxilliary boiler or water heating unit 178. Water heating unit 178 is interconnected to the thermal energy storage reservoirs 117, 119 and 121 by fluid lines 179 and 180, and in operation is adapted through suitable combustion means, heat exchanger means and fluid circulating or transfer means to augment the heat content of the stored thermal fluid in the reservoir sections, such as sections 119 and 121 indicated. Thus the system auxilliary hydrogen and oxygen fuel production as described, which is accumulated in warm weather periods and utilized later in cold weather periods for supplemental system heat delivery, provides a carry-over of system thermal capacity to meet high or peak cold weather demand and achieves a more uniform or equalized year-round utilization and higher operating efficiency. Heating unit 178 may be adapted to augment the heat content of whatever absorber fluid or thermal distribution fluid that is being stored in reservoir sections 117, 119 or 121 as may be desired. In addition, supplementary fuel, such as fuel oil or the like, is provided in standby fuel storage unit 181, which fuel may be applied through feed line 182 to the auxilliary heating unit 178 to produce additional system back-up thermal capacity for peak or emergency demand conditions beyond that provided by the hydrogen and oxygen production and storage means just described.

It will be understood that the thermal gas exchange unit 160 may alternatively be connected by its input and output thermal fluid lines 161 and 162 directly to one or more of the solar collector sections 116, 118 and 120 etc., and utilize separate feed and return lines and pump means, not shown, bypassing the thermal storage reservoirs shown. The solar collector sections may utilize concentrating type solar collector elements, such as described earlier herein, for relatively high absorber temperature operation, and may utilize a high boiling point type thermal absorber fluid, such as mentioned earlier, to achieve a high system efficiency for thermal energy collection and subsequent electrical energy production. Such overall energy collection, conversion and storage efficiency will be appreciably greater and more economical than the presently achievable utilizing solar cell electrical conversion or thermoelectric element electrical energy conversion over the same or equivalent collecting areas.

The available electrical energy output at switch 166 from generator 165 may be connected by switch 166 through suitable electrical conversion means as required, either alternatively to the electrolysis unit 170 load on line 169 or in parallel to the electrolysis load, to the outgoing electric power distribution line 183, the electrical energy being fed thereby into the local electric power system distribution grid or mains for the area. The electrical energy thus supplied to the power system grid may be supplemental thereto for meeting excess summer electrical power demand, due, for example, to excess air-conditioning loads and the like on the main electric power system. Alternatively, the electrical energy thus supplied to the main power system grid may be maintained on an extended basis, such as for night and day operation or for substantially continuous periods as a prime function of the solar-energy-to-electrical energy collection, storage and conversion system. For this maintained or extended electrical energy delivery basis it is to be noted that the thermal energy storage in sections 117, 119 and 121, the electrolytic conversion to hydrogen and oxygen fuel as produced in storage units 173 and 175, and the augmented heating of thermal storage by heating unit 178 may be adapted, proportioned and scheduled to provide for continued electrical energy supply primarily, the hydrogen and oxygen fuel being used to even generating capacity or dispensed with if desired.

It shall be understood that in the foregoing the system means for producing electrical energy output, as described with respect to FIG. 10 and also FIG. 2, as well as the means described with respect to FIGS. 5, 8 and 9, do not rely on or require that the corresponding solar energy collection sections, collecting units, collectors or collector panels be disposed over a body of water, and the solar energy collection functions may be accomplished otherwise.

In the foregoing, means have been disclosed to provide an economical and efficient solar energy collection, conversion, storage and distribution system, adaptable to a broad area of utilization with features, apparatus and means to provide system energy self-sufficiency, year-round utilization and carry-over and both thermal energy and electrical energy output. Although several combinations of the elements and means of the invention have been described, it will be apparent to those skilled in the art that many modifications, combinations or applications of the invention means disclosed, other than those hereinbefore described, are possible. All such modifications, combinations or applications of the invention means, apparatus and principles pertaining thereto are to be considered within the scope and spirit of the invention except as limited by the hereinafter appended claims.

What is claimed is:

1. A solar energy collection and distribution system comprising: a set of solar energy collecting units adapted to receive and absorb incident solar energy, a support platform assembly adapted to hold and support said energy collecting units on or near the surface of a body of water, means pertaining to the collecting units adapted to mount, position and direct each of said collecting units in a manner to orient the respective energy absorbing surfaces therein to achieve substantial exposure thereof to desired incident solar radiation thereon, protective means for the collecting units and for the platform assembly including barrier means at least partially surrounding the platform assembly in the body of water and adapted to protect the assembly from stress due to water body movement, a thermal absorber fluid for the collecting units, means whereby a portion of the collecting units produces thermal energy output only, means whereby a second portion of the collecting units produces combined thermal energy output and electrical energy output, means whereby a third portion of the collecting units concentrates incident solar radiation thereon to produce a higher absorber fluid output temperature than otherwise, a storage reservoir adjacent to said body of water for receiving the absorber fluid and for storing thermal energy collected therein, pump means and conveying duct means adapted to circulate the absorber fluid from the reservoir through the collecting units and return, external conveying means including second pump means and thermally insulated external fluid duct means for conveying portions of the absorber fluid from the reservoir to one or more thermal energy utilization points and for returning portions of the conveyed absorber fluid back to the reservoir.

2. A solar energy collection and distribution system according to claim 1 wherein said support platform assembly is substantially floatable on the body of water and is constrained from substantial lateral movement with respect to said barrier means while being permitted vertical movement thereof in accordance with the average surface elevation of the body of water; wherein said insulated external fluid duct means is carried primarily underground through most of its distribution route and is thermally insulated by a surrounding thickness of dry thermal insulating material which is maintained substantially dry by being contained in a series of water-impervious annular enclosing containers therefor which containers are affixed and substantially water-sealed to the external fluid duct means at segment intervals along the outside thereof; and wherein moisture sensing means including moisture sensing electrical probe elements having electrical test leads carried externally from said enclosing containers are adapted in said enclosing containers in a manner to permit the monitoring of possible moisture entry into said contained insulating material and to thereby determine apparent degradation of the insulation quality of the thermal insulating material in said enclosing containers.

3. A solar energy collection and distribution system according to claim 1 wherein said solar energy collecting units are each mounted on respective rotatable platform sections which are each substantially floating on said body of water and are each held centered by and rotatable about a respectively corresponding fixed vertical axis member attached to a support underframe for said platform assembly, said rotatable sections being disposed within and rotatable within surrounding fixed, substantially floatable platform sections which are mounted onto said support underframe; wherein means including motor means and drive linkage means are adapted to rotate each of said rotatable platform sections about its respective vertical axis member and also to rotate each of said energy collecting units about a respective horizontal axis in a suppport member therefor in a manner to maintain the average plane of the principal energy absorbing surfaces in each of said collecting units oriented substantially normal to the incident direct solar radiation thereon during active solar energy collecting periods; wherein a plurality of vertically running channel guide members are affixed to said barrier means and are adapted to cooperate with a respectively corresponding plurality of bearing roller means which are carried on corresponding lateral extension members of said support underframe in a manner to achieve a substantial restraint of lateral motion of said platform assembly while permitting vertical motion of said platform assembly in accordance with the water level of said body of water; and wherein said insulated external fluid duct means is thermally insulated for substantially its full length by a thickness of surrounding thermal insulation material which is maintained substantially dry by a series of water-impervious enclosing container sections therefor which are affixed and water-sealed to said external fluid duct means at intervals therealong, whether or not said external fluid duct means is carried underground during most of its route in the thermal distribution system.

4. A solar energy collection and distribution system according to claim 1 wherein a portion of said energy collecting units contains one or more solar energy collecting panel sections each of which include: a thermally insulated collector panel frame containing one or more solar energy absorbing compartments and also containing one or more thermal insulating covering layers over said absorbing compartments which layers are substantially transmissive to incident solar radiation, said absorbing compartments each including therein a thermal absorbing surface having a thermal absorber fluid duct attached thereto and having a thermal absorber fluid passed therethrough; wherein certain ones of said absorbing compartments contain therein a set of solar electric energy conversion cells mounted overlaying said absorbing surface and exposed to incident solar radiation, said cells being electrically insulated from one another and also electrically insulated from and cooled by said absorbing surface whereby said cells are adapted to produce direct electrical energy output from incident solar radiation thereon; wherein certain other ones of said absorbing compartments contain a set of thermoelectric energy conversion elements which are mounted against said absorbing surface and are electrically insulated therefrom, said conversion elements being adapted to have their respective cold junctions cooled by said absorbing surface and have their respective hot junctions receiving incident solar thermal energy to produce thereby direct electrical energy output; wherein electrically interconnecting means are adapted to combine and carry the electrical energy outputs from said solar electric conversion cells for use in an external utilization circuit; and wherein other electrically interconnecting means are adapted to combine and carry the electrical energy outputs from said thermoelectric conversion elements for use in an external utilization circuit.

5. A solar energy collection and distribution system according to claim 1 wherein said third portion of the said energy collecting units having means to produce a higher absorber fluid output temperature than other collecting units contains in said third portion one or more solar energy collecting panel sections each of which includes: a thermally insulated collector panel frame containing one or more solar energy absorbing compartments and also containing one or more thermal insulating covering layers over each of the absorbing compartments which layers are substantially transmissive to incident solar radiation and are mounted onto the panel frame in a substantially weather-tight manner, each absorbing compartment including therein a thermal absorbing unit and a concentrating type reflecting unit which extend together in uniform manner for the active energy-collecting length of the compartment; wherein each absorbing unit includes a thermally conductive duct for the absorber fluid to pass therethrough and a thermally conductive absorber surface section attached thereto, the resulting absorbing unit having an effective crosssection which is appreciably narrower widthwise than the width of the compartment and which is elongated depthwise in the compartment and is positioned therein in a manner to enclose an appreciable depthwise focal region for the reflecting unit, the thermally conductive duct having means to connect to the conveying duct means for the absorber fluid; wherein the reflecting unit in each absorbing compartment is formed having a smooth, rigid, concave cylindrical reflecting surface whose cross-sectional contour widthwise in the compartment approximates a portion of a parabola, the reflecting unit having a sufficient surface area and being positioned in the compartment such that incoming direct solar radiation which is nearly normal to the faces of the said covering layers and which is not directly intercepted by the absorbing unit frontally exposed surfaces will be concentrated the reflected by the reflecting unit toward the said depthwise focal region and onto the absorbing unit; and wherein the said means to move and direct the said energy collecting units includes motor means and drive linkage means adapted to move and orient the collecting units in a manner to maintain the plane of the said covering layers of the collector panels therein in a plane substantially normal to the incident direct solar radiation, whereby the resultant concentration of incident solar radiation on each of said absorbing units produces a higher absorbing temperature in the absorbing units and in the absorber fluid therein than would occur under corresponding conditions except without the said radiation concentrating means and corresponding absorbing unit means.

6. A solar energy collection and distribution system according to claim 5 wherein the said covering layers over the energy absorbing compartments in the said collector panel sections comprises in each panel section a covering assembly which includes: at least two adjacent sheets of rigid thermal insulating material extending substantially over the active energy-collecting area of the corresponding absorbing compartments, said sheets being substantially transmissive to incident solar radiation, said sheets being joined and sealed to rigid sidewall members that are carried around the full edge periphery of the said sheets in a manner to effect a sealed enclosure therebetween, a set of interspacing pillars of rigid material affixed between the faces of adjacent sheets at intervals over the internal facing areas thereof in a manner to provide separation and support between adjacent sheets against negative pressures therebetween, means whereby the interspaces between the said sheets are substantially evacuated of gas and are then sealed against subsequent gas leakage therein, and means whereby the said covering assembly is mounted in the collector panel section and over the corresponding absorbing compartments in a substantially weather-tight manner, whereby there is minimal transfer of thermal energy from within said absorbing compartments outwardly between said sheets and through said covering assembly.

7. A solar energy collection and distribution system according to claim 1 wherein the said body of water is substantially impounded beneath the said platform assembly by being contained within said barrier means and above the sustaining earth and is adapted to constitute the thermal energy storage medium for collected solar thermal energy and to provide the thermal absorber fluid therefor, the platform assembly being substantially floating on the body of water and containing a layer of light-weight thermal insulation material which substantially covers the water surface in a manner to effect the upper insulation therefor; wherein other insulation means is adapted to provide further insulation and containment for the storage medium by substantially surrounding the bottom and sides of the body of water, said other insulating means including a quantity of thermal insulation material that is contained in a set of substantially water-impervious container compartments which are disposed in a substantially continuous layer abutting one another and interposed between one or more extended sheets of water barrier layer members overlaying the container compartments and separating them from the water body on one side and the containing earth and the barrier means on the other side in a manner to prevent passage of water into and out of the body of water with respect to the containing earth and barrier means, whereby said quantity of thermal insulation material is maintained substantially dry and thermally effective and whereby the body of water is thermally insulated on all sides and is contained between the platform assembly on its upper surface and the surrounding earth and barrier means on its remaining sides to effect the said storage reservoir for thermal energy; wherein water replenishment means including an external water supply means and conveying means thereof is adapted to effect replenishment of water lost from said body of water due to leakage, evaporation and utilization loss; and wherein said protective means for the collecting units also includes covering roof means extended over the platform assembly and consisting of: a roof structure formed of substantially rigid, light-weight roof panel section held together and sealed in a substantially weather-tight manner in a rigid, fabricated support frame therefor, the support frame being extended to substantially cover over and enclose the space occupied by the collecting units, the roof panel sections being substantially transmissive to incident solar radiation, means for mounting and supporting the roof structure in a stabilized manner over the platform assembly to withstand prevailing weather conditions, whereby the platform assembly and the solar energy collecting units are protected against adverse environmental effects.

8. A system for collection, conversion and distribution of solar energy which includes: one or more solar energy collection sections that are disposed over an effective solar energy collecting area, each of the collection sections containing a set of solar energy collector units which in turn each contain one or more solar energy collecting panel sections that are adapted to receive, collect and convert incident solar energy;

means pertaining to each of said panel sections, including absorber unit means and a quantity of thermal energy absorber fluid, for absorbing and for transferring to external means a portion of the thermal energy available from said incident solar energy collected in said panel sections;

thermal storage reservoir means corresponding to the collection sections and adapted for receiving said absorber fluid from said panel sections and for accumulating in the reservoir means thermal energy transferred with said absorber fluid;

conveying means, including pump means and insulated conveying duct means, for conveying and for circulating said absorber fluid from said reservoir means through said panel sections and back to said reservoir means;

distribution means, including second conveying means and also thermal exchange means, for conveying and distributing portions of the thermal energy from said reservoir means and also cooling energy to one or more energy utilization points;

conversion means pertaining to a portion of said panel sections for producing from the collected solar energy therein an output of thermal energy in the absorber fluid passed therethrough and also an output of electrical energy which is provided on electrical terminals therein;

means for utilizing a portion of said electrical energy output from said portions of said panel sections to operate and control auxiliary apparatus means associated with said system;

second conversion means pertaining to a second portion of said panel sections for concentrating the received solar energy collected therein and to produce therefrom an output of absorber fluid which is of higher temperature than would be obtained without employing the concentrating means;

means, including controlled motor means, for moving and directing at least said second portion of said panel sections in a manner to receive most efficiently incident direct solar radiation for said concentrating means;

means for conveying said absorber fluid of higher temperature from said second portion of panel sections to a portion of said reservoir means and then back through the panel sections;

means, including heat exchanger means and heat power conversion means which employs a heat power working fluid having lower boiling point than said absorber fluid of higher temperature, adapted for utilizing a portion of the absorber fluid of higher temperature to produce drive energy for electrical generation means and to thereby produce a generated electrical power output;

means, including electrical connection means, for distributing a portion of said generated electrical power to utilization means;

means for supplying a quantity of water to said system for electrolysis thereof;

means, including electrochemical conversion means and gas storage means, adapted for utilizing a portion of said generated electrical power to electrolyze said supplied water and to produce and store the gaseous products, hydrogen and oxygen, from such electrolysis;

and means, including thermal combustion means and heat transfer means, adapted for utilizing the said stored gaseous products at an appropriate time to augment the thermal energy content of said reservoir means, to thereby provide a system thermal energy carry-over for varying thermal energy demand by said utilization points over a period of time.

9. A system according to claim 8 wherein said conversion means pertaining to said portion of panel sections for producing electrical energy output is dispensed with whereas the means therein for producing thermal energy output therefrom is retained; wherein said means for utilizing a portion of said electrical energy output from said panel sections is also dispensed with; wherein said second conversion means pertaining to said second portion of panel sections includes in each panel section the following: a thermally insulated collector panel frame containing one or more solar energy absorbing compartments and also containing a thermally insulating covering assembly over said compartments which assembly consists of at least two adjacent plates of rigid thermal insulating material extending substantially over the active energy-collecting area of said absorbing compartments, said plates being substantially transmissive to incident solar radiation, said plates being joined and sealed to rigid sidewall members that are carried around the full edge periphery of said plates in a manner to effect a sealed enclosure therebetween, a set of rigid, narrow interspacing pillars affixed to and between the plates at intervals over the internal facing areas thereof in a manner to provide separation and support between the plates against negative pressures therebetween, the interspaces between the plates then being substantially evacuated of gas and also being then sealed against subsequent gas leakage thereinto, said covering assembly being mounted in the panel section and over the absorbing compartments in a substantially weather-tight manner, each absorbing compartment including therein a thermal absorbing unit and a corresponding associated concentrating type reflecting unit which both extend together in uniform manner for the active energy-collecting length of the compartment, each absorbing unit having a thermally conductive duct for the absorber fluid to pass through and a thermally conductive absorber surface member attached thereto, the resulting absorbing unit having an effective cross-section which is relatively narrow widthwise with respect to the width of the compartment and which is elongated depthwise in the compartment and is also positioned therein in a manner to enclose an appreciable depthwise focal region for the reflecting unit, the reflecting unit being formed having a smooth, rigid concave cylindrical reflecting surface whose cross-sectional contour widthwise in the compartment approximates a portion of a parabola, the reflecting unit having a sufficient surface area and also being positioned in the compartment such that incoming direct solar radiation which is nearly normal to the principal input faces of the said covering assembly and which is not directly intercepted by the direct frontally exposed absorbing unit surfaces will be concentrated and reflected by the reflecting unit toward the said depthwise focal region and onto the absorbing unit, the absorbing unit having an outside surface area less than the projected frontal area of the compartment; and wherein said means for moving and directing at least said second portion of panel sections includes controlled motor means and associated drive linkage means adapted to move and orient the panel sections in a manner to maintain the plane of the input face of said covering assembly substantially normal to the incident direct solar radiation during energy-collecting periods; whereby the resultant concentration of incident solar radiation on said absorbing units produces a higher absorber fluid output temperature from said panel sections than would occur without said radiation concentrating means and whereby said system produces said generated electrical power output and further produces said gaseous products and thereafter achieves said augmented thermal energy content in said reservoir means and thereby provides distributed thermal energy and also distributed electrical energy to said utilization points.

10. A system according to claim 9 wherein said means for supplying said quantity of water for electrolysis is dispensed with; wherein said means including electrochemical conversion means and gas storage means is also dispensed with; wherein said means including thermal combustion means and heat transfer means for utilizing said stored gaseous products is also dispensed with; wherein said thermal storage reservoir means includes in one or more portions therein a quantity of thermal energy transfer fluid, separate from the absorber fluid therein, for distribution of stored thermal energy from said reservoir means to said energy utilization points and also includes therein heat exchanger means adapted to effect exchange of heat energy content from said absorber fluid to said transfer fluid; wherein said distribution means includes at least one heat energy auxilliary storage reservoir which has associated external duct means and flow path control means, said distribution means being adapted to selectively convey portions of said transfer fluid from said reservoir means to said auxilliary storage reservoir for intermediate storage therein and also to selectively convey portions of said transfer fluid from either said reservoir means or said auxiliary storage reservoir to said utilization points and to return portions of the transfer fluid to the reservoir means; and wherein said means including heat exchanger means and heat power conversion means includes: conveying means adapted to convey portions of said absorber fluid of higher temperature from said reservoir means to a first heat exchanger section and to return the absorber fluid to the reservoir means, said first heat exchanger section containing pressure boiler means which employs a working fluid therein which has a boiling point lower than that of said absorber fluid of higher temperature and is adapted to extract heat energy from the absorber fluid and to produce therefrom boiler working gas pressure from the working fluid, means for applying the boiler working gas pressure to activate said heat power conversion means and to produce thereby mechanical drive power output for energizing the said electrical power generation means, working gas condensing and recycling means including working gas conveying means, a second heat exchanger section and an associated fluid cooling means therefor adapted for condensing the spent working gas from the heat power conversion means and for injecting the condensed working gas into said pressure boiler means to enable repeating the thermal-energy-to-mechanical-energy conversion cycle for maintaining mechanical energy drive to said electrical power generation means and to thereby produce said generated electrical power output; whereby said system collects solar energy, converts the collected solar energy to stored thermal energy and also to generated electrical energy and thereafter distributes portions of both the stored thermal energy and the generated electrical energy to a plurality of energy utilization points.

11. A system according to claim 8 wherein said conversion means pertaining to a portion of said panel sections for producing both an output of thermal energy and an output of electrical energy includes in each panel section a thermally insulated collecting panel frame which contains one or more solar energy absorbing compartments and also contains one or more thermally insulating covers over said absorbing compartments, which covers are substantially transmissive to incident solar radiation and are mounted in the panel frame and over the absorbing compartments in a substantially weather-tight manner, each absorbing compartment containing therein a composite solar energy conversion unit which includes: a thermal energy absorbing surface having a thermal absorber fluid duct attached for thermal conduction therebetween, said surface and said duct being mounted fixedly in the compartment and extending throught the compartment for substantially the active energy-collecting length thereof, a first layer of electrical insulation which layer is thermally conductive and is affixed overlaying said surface on at least one face thereof, next a layer of thermoelectric conversion cold junction elements affixed against and substantially overlaying said first layer which elements are electrically insulated from each other and are in substantial thermal cooling contact with said surface, next a second insulation layer of electrical insulation which is also thermally insulating and is affixed over and substantially covering said cold junction elements, next a layer of thermoelectric conversion hot junction elements affixed against and substantially overlaying said second insulation layer, a first set of electrical output terminals for said layers of thermoelectric elements and affixed in said panel frame, electrical conductor means affixed between said thermoelectric elements hot-junction-to-cold-junction and across said second insulation layer in a manner to interconnect and combine the electrical outputs from the thermoelectric elements, said electrical conductor means then further carrying the combined electrical outputs to said electrical output terminals, next a third layer of electrical insulation which is substantially transmissive to thermal energy across it and which substantially overlays said layer of hot junction elements, next a set of electrical conversion solar cell elements disposed and affixed over the third layer of insulation in a manner to partially cover the third insulation layer and to permit portions of incident solar energy to the compartment to pass through the third insulation layer to the layer of hot junction elements such that the hot junction elements are thermally energized to achieve a temperature appreciably above that of the correspondingly associated cold junction elements aforesaid, said solar cell elements being electrically insulated from each other and being exposed to incident solar radiation into the compartment in a manner to be energized therefrom and to thereby produce electrical energy output, a second set of electrical output terminals for said solar cell elements and affixed in said panel frame, second electrical conductor means affixed between the electrodes of the solar cell elements in a manner to interconnect and combine the electrical energy outputs therefrom and also to carry the combined electrical energy output to said second set of output terminals; wherein means are adapted to convey portions of said absorber fluid for said pertions of said panel sections through said absorber fluid duct attached to said absorbing surface; and wherein said means for utilizing a portion of the electrical energy output from said portions of said panel sections includes electrical connection bus means adapted for connecting to said first set of electrical output terminals and also for connecting to said second set of electrical output terminals and for carrying the electrical outputs therefrom to external means, said external means including electrical storage and conversion means adapted to receive electrical output energy from said connection bus means and to store portions of said electrical output energy and also to convert and apply portions of said electrical output energy to effect operation and control of auxiliary apparatus means associated with said system and thereby render the system substantially self-sufficient in operating energy; whereby said system achieves collection of solar energy, conversion of portions of the collected energy to stored thermal energy, distribution of portions of the stored thermal energy to a plurality of energy utilization points, conversion of portions of the collected energy to electrical output energy, utilization of portions of the electrical output energy to render the system substantially self-sufficient in operating energy, distribution of other portions of the electrical output energy to energy utilization points, and utilization of still further portions of the electrical output energy to obtain chemical energy products which are stored and are later converted by combustion to augment the aforesaid stored thermal energy at appropriate times to meet varying thermal energy demand on the system.

12. A system according to claim 10 wherein the said solar energy collection sections are disposed substantially at the surface of a body of water, each of the collection sections including a substantially floating platform assembly which contains a set of said solar energy collector units, each collection section also including protective barrier means for the platform assembly, the barrier means being constructed to at least partially surround the platform assembly as a breakwater barrier therefor having support and stabilizing means for itself in said body of water and being adapted to protect the platform assembly from stresses due to water movement in the body of water, the platform assembly including a support underframe therefor which is formed with lightweight structural members affixed together in a structure which is adapted to contain and hold a body of substantially floatable platform fixed portions that are correlated with the collector units; wherein the set of collector units are all mounted on respective rotatable circular platform sections which are each substantially floating on the body of water and are each held centered by and rotatable about a respectively corresponding fixed vertical axis member which is attached to said support underframe, said rotatable sections being disposed within and rotatable within respectively corresponding circular openings in said platform fixed portions; wherein said thermal storage reservoir means is located adjacent to said body of water and contains one or more storage sections which are each adapted to receive conveyed absorber fluid from a respectively corresponding collection section and to store thermal energy therefrom; wherein said insulated conveying duct means for said absorber fluid is disposed partially under the body of water surface in its route between the reservoir means and a respective collection section and corresponding platform section and is thermally insulated by a surrounding thickness of light-weight thermal insulating material which is maintained substantially dry by being contained is a series of substantially water-impervous annular enclosing containers therefor which containers are affixed and substantially water-sealed onto and around the conveying duct means at lengthwise intervals along the outside thereof; wherein said distribution means is further adapted to convey said cooling energy to said utilization points periodically and alternatively to the said conveyance of thermal energy from said reservoir means and in a cooling cycle phase of the distribution means, said cooling cycle phase including: means for supplying a fresh water supply into the distribution means as a cooling fluid for distribution, filtering and purifying means for the cooling fluid adapted in the distribution means, cooling fluid conveying means including distribution pump means and conveying cooling duct means for the cooling fluid, selectable flow-path control means in the cooling duct means for directing the cooling fluid flow through the cooling cycle phase and to and from the utilization points, said thermal exchange means including a cooling heat exchanger and also an auxilliary cooling booster means in the cooling cycle phase, the cooling heat exchanger being submerged in said body of water and adapted to receive cooling fluid conveyed in the cooling duct means and to effect substantial cooling thereof and to enable passing the cooled fluid therefrom through an output duct to the cooling booster means, the auxilliary cooling booster means including a heat transfer working fluid and heat pump type thermal exchanger means which utilizes hot absorber fluid that is circulated therethrough from said storage reservoir means to cooperate with heat transfer elements therein to effect further cooling of the cooling fluid conveyed through said output duct to the booster means, the booster means then enabling the further cooled fluid to be passed therefrom through an output cool duct to the distribution pump means, the distribution pump means being adapted in cooperation with the said flow-path control means to firstly effect charging of the cooling fluid from said fresh water supply into the cooling cycle distribution means and secondly to effect circulation of the cooling fluid through the conveying cooling duct means from the cooling booster means to and from the utilization points and back to the cooling heat exchanger and thence to the cooling booster means to complete a distribution cycle in the cooling cycle phase and thirdly to alternatively effect the ejection and flushing of the cooling fluid from the cooling cycle distribution means into said body of water when the system cooling cycle phase is to be discontinued; and wherein said means for moving and directing at least said second portion of said panel sections includes means including motor means and associated drive linkage means adapted to rotate each of said rotatable platform sections about its respective vertical axis member and also to rotate each of said energy collector units about a respective horizontal axle member in a mounting support member therefor in a manner to maintain the said panel sections therein oriented such that the plane of the solar energy input face of each respective panel section in substantially normal to the incident direct solar radiation thereon during active solar energy collecting periods; whereby the rotatable platform sections require a minimum of drive energy for roation thereof for energy collection alignment and whereby said system achieves collection of solar energy, conversion of portions of the collected energy to stored thermal energy, distribution of portions of the stored thermal energy to a plurality of energy utilization points, conversion of other portions of the stored thermal energy in conjunction with latent cooling energy pertaining to the said body of water associated with said system to effect the cooling of a cooling fluid for distribution, alternative distribution of the cooling fluid to the utilization points in place of the distribution of the said stored thermal energy, conversion of other portions of the collected energy to electrical output energy, and distribution of portions of the electrical output energy to energy utilization points.

* * * * *